US012588393B2

(12) United States Patent　(10) Patent No.:　US 12,588,393 B2
Peng　(45) Date of Patent:　Mar. 24, 2026

(54) DISPLAY PANEL AND DISPLAY DEVICE WITH OPENINGS IN THE TRANSITION AREAS

(71) Applicant: WUHAN CHINA STAR OPTOELECTRONICS SEMICONDUCTOR DISPLAY TECHNOLOGY CO., LTD., Wuhan (CN)

(72) Inventor: Simin Peng, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 735 days.

(21) Appl. No.: 17/754,255

(22) PCT Filed: Mar. 24, 2022

(86) PCT No.: PCT/CN2022/082646
§ 371 (c)(1),
(2) Date: Mar. 29, 2022

(87) PCT Pub. No.: WO2023/173459
PCT Pub. Date: Sep. 21, 2023

(65) Prior Publication Data
US 2024/0057449 A1　Feb. 15, 2024

(30) Foreign Application Priority Data

Mar. 14, 2022　(CN) ......................... 202210244656.2

(51) Int. Cl.
H10K 59/80　(2023.01)
H10K 59/124　(2023.01)

(52) U.S. Cl.
CPC ......... H10K 59/873 (2023.02); H10K 59/124 (2023.02)

(58) Field of Classification Search
CPC .... H10K 59/873; H10K 59/124; H10K 59/88; H10K 59/8731; H10K 59/65;
(Continued)

(56) References Cited

U.S. PATENT DOCUMENTS 11,264,440 B2 *　3/2022　Gao ...................... H10K 59/873
2017/0271421 A1 *　9/2017　Jinbo ................ H10K 59/8722
(Continued)

FOREIGN PATENT DOCUMENTS

CN　110265583 A　9/2019
CN　110429118 A　11/2019
(Continued)

OTHER PUBLICATIONS

International Search Report in International application No. PCT/CN2022/082646, mailed on Jul. 27, 2022.
(Continued)

*Primary Examiner* — Wael M Fahmy
*Assistant Examiner* — Tiberiu Dan Onuta
(74) *Attorney, Agent, or Firm* — PV IP PC; Wei Te Chung

(57)　ABSTRACT

A display panel and a display device are provided. The display device includes a display panel. The display panel includes a photosensitive area, a transition area, and a display area. The display panel further includes a base substrate, a drive circuit layer, and a light-emitting layer. By disconnecting the light-emitting layer in an opening on the base substrate, a lateral intrusion path from a through-hole in the photosensitive area to the display area for water and
(Continued)

oxygen can be blocked. Therefore, poor display such as black hole spots caused by water and oxygen intrusion can be solved.

15 Claims, 6 Drawing Sheets

(58) Field of Classification Search
CPC .... H10K 59/12; H10K 59/60; H10K 50/8445; H10K 50/844; H10K 71/00
See application file for complete search history.

(56) References Cited

U.S. PATENT DOCUMENTS

| | | | | |
|---|---|---|---|---|
| 2020/0083475 A1* | 3/2020 | Kang | .................... | H10K 59/124 |
| 2021/0066657 A1* | 3/2021 | Chen | .................... | H10K 50/844 |
| 2021/0273029 A1* | 9/2021 | Bang | .................... | H10K 59/122 |
| 2022/0158131 A1* | 5/2022 | Sung | .................... | H10K 77/111 |

FOREIGN PATENT DOCUMENTS

| | | | | | |
|---|---|---|---|---|---|
| CN | 110459700 A | | 11/2019 | | |
| CN | 110634928 A | | 12/2019 | | |
| CN | 110660828 A | | 1/2020 | | |
| CN | 111403621 A | | 7/2020 | | |
| CN | 111755493 A | * | 10/2020 | ............. | H10K 50/84 |
| CN | 112447924 A | | 3/2021 | | |
| CN | 112531003 A | | 3/2021 | | |
| CN | 112713252 A | | 4/2021 | | |
| CN | 112885882 A | | 6/2021 | | |
| CN | 113314567 A | | 8/2021 | | |
| CN | 113964167 A | | 1/2022 | | |
| CN | 114203774 A | | 3/2022 | | |
| JP | 2007256390 A | | 10/2007 | | |
| JP | 2008134908 A | | 6/2008 | | |
| KR | 20170081110 A | | 7/2017 | | |

OTHER PUBLICATIONS

Written Opinion of the International Search Authority in International application No. PCT/CN2022/082646, mailed on Jul. 27, 2022.

Chinese Office Action issued in corresponding Chinese Patent Application No. 202210244656.2 dated Nov. 2, 2022, pp. 1-8.

* cited by examiner

DISPLAY PANEL AND DISPLAY DEVICE WITH OPENINGS IN THE TRANSITION AREAS

FIELD OF INVENTION

The present disclosure relates to the field of display technologies, and more particularly, to a display panel and a display device.

BACKGROUND OF INVENTION

Organic light-emitting diode (OLED) display technology is a display technology of self-illumination and does not need backlight. Also, it has advantages such as high brightness, low power consumption, wide viewing angle, and fast response times, and has been widely used in mobile phone panel display industries. In addition to display surfaces, display panels also have components such as cameras, earpieces, microphones, and circuits, which also occupy a considerable portion of screens.

Technical problem: at present, the most commonly used process in products on the market is to dig holes at edges of a photosensitive area of a base substrate to form a groove. Therefore, a common layer can be disconnected in the groove, so a lateral intrusion path of water and oxygen from the common layer can be blocked. Although this design minimizes the risk of lateral intrusion of water and oxygen, it increases a vertical intrusion path of water and oxygen from a base substrate side. Since the base substrate in the photosensitive area is completely exposed to high humidity after cut, water and oxygen can easily enter from a lateral side of the base substrate, accumulate in base substrate material under the groove, and enter a display area through gaps, pinholes, and cracks in inorganic film layers, thereby causing light-emitting materials of light-emitting layers in the display area to lose effectiveness and having poor display such as black hole spots. In addition, inconsistency of a structure of the groove (such as depth, width, etc.) will also affect quality of films of encapsulation layers deposited in the groove, thereby affecting encapsulation effect, increasing a probability of black hole spots, and seriously affecting product quality.

In summary, current display panels have problems of poor display such as black hole spots, which is caused by water and oxygen laterally intruding into the display area from a through-hole of the base substrate in the photosensitive area. Therefore, it is necessary to provide a display panel and a display device to improve this defect.

SUMMARY OF INVENTION

The embodiments of the present disclosure provide a display panel and a display device to solve the problems of poor display such as black hole spots caused by water and oxygen laterally intruding into a display area from a through-hole of a base substrate in a photosensitive area in current display panels.

An embodiment of the present disclosure provides a display panel, which has a photosensitive area, a transition area surrounding the photosensitive area, and a display area surrounding the transition area and includes:

a base substrate including a substrate, a first inorganic layer, and a first organic layer stacked in sequence;

a drive circuit layer disposed on one side of the base substrate, wherein, the drive circuit layer includes a second inorganic layer, the first organic layer is disposed between the first inorganic layer and the second inorganic layer, the second inorganic layer is provided with a first opening in the transition area, the first organic layer is provided with a second opening in the transition area, the first opening is connected to the second opening, and a width of the first opening is less than a width of the second opening;

a light-emitting layer disposed on one side of the drive circuit layer away from the base substrate, wherein, the light-emitting layer covers the transition area and has a disconnected setting in the second opening; and an encapsulation layer disposed on one side of the light-emitting layer away from the base substrate.

According to an embodiment of the present disclosure, a bottom surface of the second opening is in contact with one side surface of the first inorganic layer adjacent to the first organic layer.

According to an embodiment of the present disclosure, in the second opening, the light-emitting layer is disposed on the side surface of the first inorganic layer adjacent to the first organic layer, and a width of the light-emitting layer in the second opening is less than a width of the bottom surface of the second opening.

According to an embodiment of the present disclosure, the encapsulation layer is disposed continuously in the second opening.

According to an embodiment of the present disclosure, in the second opening, the encapsulation layer is in contact with a side wall of the second opening, the side surface of the first inorganic layer adjacent to the first organic layer, and one side surface of the light-emitting layer away from the first inorganic layer.

According to an embodiment of the present disclosure, an orthographic projection of the first opening on the first inorganic layer is within an orthographic projection of the second opening on the first inorganic layer.

According to an embodiment of the present disclosure, a length from an edge of any side of the first opening to an edge of the second opening on a same side is greater than 0 and is less than or equal to 2 μm.

According to an embodiment of the present disclosure, a distance between one side surface of the first inorganic layer adjacent to the second inorganic layer and one side surface of the second inorganic layer adjacent to the first inorganic layer ranges from 1.5 μm to 3 μm.

According to an embodiment of the present disclosure, materials of the first inorganic layer and the second inorganic layer are same.

According to an embodiment of the present disclosure, the substrate includes a second organic layer disposed on one side of the first inorganic layer away from the first organic layer, and a material of the second organic layer is same as a material of the first organic layer.

According to an embodiment of the present disclosure, the display panel includes a retaining wall disposed in the transition area and surrounding the photosensitive area, wherein, the retaining wall is disposed on one side of the second inorganic layer away from the first organic layer; and wherein, one side of the retaining wall adjacent to the photosensitive area and one side of the retaining wall away from the photosensitive area are both provided with the first opening and the second opening.

According to an embodiment of the present disclosure, the drive circuit layer includes a third organic layer, the light-emitting layer is disposed on the third organic layer, and a material of the retaining wall is same as a material of the third organic layer.

According to an embodiment of the present disclosure, the base substrate and the drive circuit layer are provided with a through-hole in the photosensitive area.

An embodiment of the present disclosure further provides a display device, which includes a photosensitive device and a display panel, wherein, the display panel has a photosensitive area, a transition area surrounding the photosensitive area, and a display area surrounding the transition area and includes:

a base substrate including a substrate, a first inorganic layer, and a first organic layer stacked in sequence;

a drive circuit layer disposed on one side of the base substrate, wherein, the drive circuit layer includes a second inorganic layer, the first organic layer is disposed between the first inorganic layer and the second inorganic layer, the second inorganic layer is provided with a first opening in the transition area, the first organic layer is provided with a second opening in the transition area, the first opening is connected to the second opening, and a width of the first opening is less than a width of the second opening;

a light-emitting layer disposed on one side of the drive circuit layer away from the base substrate, wherein, the light-emitting layer covers the transition area and has a disconnected setting in the second opening; and an encapsulation layer disposed on one side of the light-emitting layer away from the base substrate.

According to an embodiment of the present disclosure, a bottom surface of the second opening is in contact with one side surface of the first inorganic layer adjacent to the first organic layer.

According to an embodiment of the present disclosure, in the second opening, the light-emitting layer is disposed on the side surface of the first inorganic layer adjacent to the first organic layer, and a width of the light-emitting layer in the second opening is less than a width of the bottom surface of the second opening.

According to an embodiment of the present disclosure, the encapsulation layer is disposed continuously in the second opening.

According to an embodiment of the present disclosure, in the second opening, the encapsulation layer is in contact with a side wall of the second opening, the side surface of the first inorganic layer adjacent to the first organic layer, and one side surface of the light-emitting layer away from the first inorganic layer.

According to an embodiment of the present disclosure, an orthographic projection of the first opening on the first inorganic layer is within an orthographic projection of the second opening on the first inorganic layer.

According to an embodiment of the present disclosure, a length from an edge of any side of the first opening to an edge of the second opening on a same side is greater than 0 and is less than or equal to 2 μm.

Beneficial effect: beneficial effects of the present disclosure: the embodiments of the present disclosure provide the display panel and the display device. The display device includes the display panel. The display panel has a photosensitive area, a transition area surrounding the photosensitive area, and a display area surrounding the transition area and includes: a base substrate including a first inorganic layer and a first organic layer stacked in sequence; a drive circuit layer disposed on one side of the base substrate, wherein, the drive circuit layer includes a second inorganic layer, the first organic layer is disposed between the first inorganic layer and the second inorganic layer, the second inorganic layer is provided with a first opening in the transition area, the first organic layer is provided with a second opening in the transition area, the first opening is connected to the second opening, and a width of the first opening is less than a width of the second opening; a light-emitting layer disposed on one side of the drive circuit layer away from the base substrate, wherein, the light-emitting layer covers the transition area and has a disconnected setting in the second opening; and an encapsulation layer disposed on one side of the light-emitting layer away from the base substrate. Therefore, by disconnecting the light-emitting layer in the second opening on the base substrate, a lateral intrusion path from the through-hole in the photosensitive area to the display area for water and oxygen can be blocked, thereby preventing water and oxygen from accumulating in the transition area. Therefore, poor display such as black hole spots caused by water and oxygen intrusion can be solved.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION OF PREFERRED EMBODIMENTS

Figure 1:
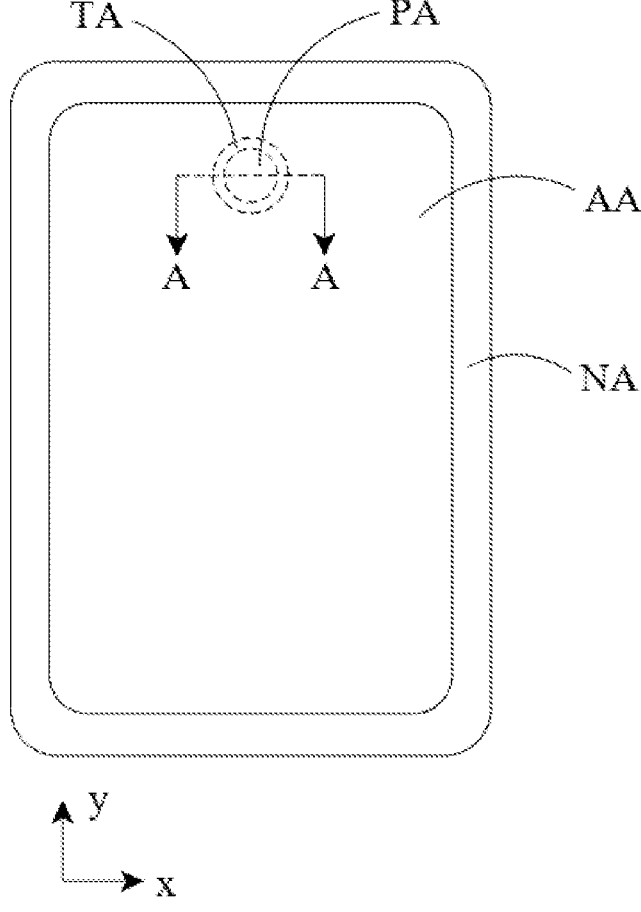
FIG. 1 is a schematic planar diagram of a display panel according to an embodiment of the present disclosure.

The specific embodiments described with reference to the attached drawings are all exemplary and are intended to illustrate and interpret the present disclosure. In the description of the present disclosure, it should be understood that terms such as "upper", "lower", "front", "rear", "left", "right", "inside", "outside", "side", as well as derivative thereof should be construed to refer to the orientation as described or as shown in the drawings under discussion. Therefore, the directional terms used are to illustrate and understand the present disclosure, not to limit the present disclosure. The identical or similar reference numerals constantly denote the identical or similar elements or elements having the identical or similar functions in the drawings.

The present disclosure will be further explained below in conjunction with the drawings and specific embodiments.

An embodiment of the present disclosure provides a display panel. As shown in FIG. 1, FIG. 1 is a schematic planar diagram of the display panel according to an embodiment of the present disclosure. The display panel includes a photosensitive area PA, a transition area TA surrounding the photosensitive area PA, a display area AA surrounding the transition area TA, and a non-display area NA disposed around the display area AA.

The display area AA is used to realize a function of screen display. For example, a plurality of pixels configured to emit light are arranged in an array in the display area AA, and the pixels can emit light under driven of a pixel driving circuit to realize the function of screen display. The photosensitive area may be used to acquire and perceive ambient light. For example, an optical sensor may be disposed in the photosensitive area PA, and the optical sensor can acquire the ambient light, convert acquired light into corresponding electrical signals, and transmit the electrical signals to a processor for processing. The optical sensor may be a camera, and it can realize under-screen photograph or face recognition by installing the camera in the photosensitive area PA.

It should be noted that in following description, a first direction x is a width direction of the display panel, a second direction y is a length direction of the display panel, a third direction z is a thickness direction of the display panel, and the third direction z is perpendicular to the first direction x and the second direction y.

Figure 2:
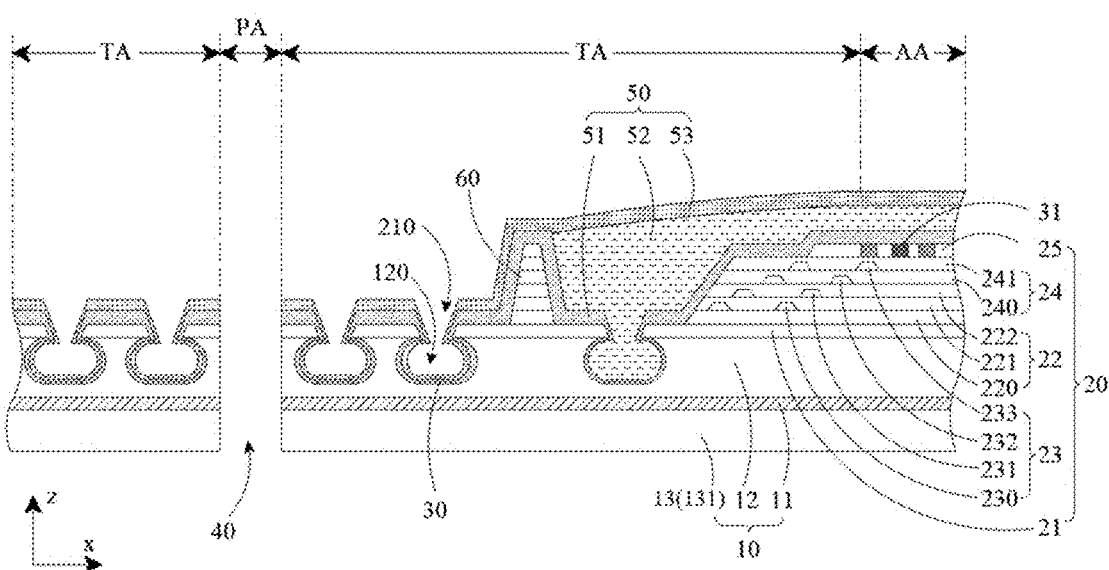
FIG. 2 is a first schematic partial cross-sectional structural diagram of the display panel along a direction A-A according to an embodiment of the present disclosure.

As shown in FIG. 2, FIG. 2 is a first schematic partial cross-sectional structural diagram of the display panel along a direction A-A according to an embodiment of the present disclosure. The display panel further includes a base substrate 10 and a drive circuit layer 20, the base substrate 10 includes a substrate 13, a first inorganic layer 11, and a first organic layer 12 that are stacked in sequence, and the drive circuit layer 20 is disposed on one side of the first organic layer 12 away from the first inorganic layer 11.

The substrate 13 includes a second organic layer 131, and the second organic layer 131 is disposed on one side of the first inorganic layer 11 away from the first organic layer 12.

In this embodiment of the present disclosure, the substrate 13 may be a single-layered organic film layer structure composed of the second organic layer. In some embodiments, the substrate 13 may also be a two-layered or multi-layered organic film layer structure composed of two layers or multiple layers of organic film layers stacked in sequence on the side of the first inorganic layer 11 away from the first organic layer 12.

In this embodiment, the first inorganic layer 11 is prepared from an inorganic material and has a good ability to block water and oxygen.

Specifically, a material of the first inorganic layer 11 may be one of silicon nitride, silicon oxide, or silicon oxynitride. A water vapor transmission rate (WVTR) of the first inorganic layer 11 is about 10-6/m2/day.

The first organic layer 12 and the second organic layer may be prepared from organic materials. For example, the organic materials may include, but are not limited to, one or more mixtures of polyimide (PI), polyamide (PA), polycarbonate (PC), polyphenylene ether sulfone (PES), polyethylene terephthalate (PET), polyethylene naphthalate (PEN), polymethyl methacrylate (PMMA), or cyclic olefin copolymer (COC).

Preferably, materials of the first organic layer 12 and second organic layer are same. The drive circuit layer 20 includes a second inorganic layer 21, and a plurality of insulating layers 22, a plurality of metal layers 23, a plurality of planarization layers 24, and a third organic layer 25 stacked on one side of the second inorganic layer 21 away from the base substrate 10.

In this embodiment, the second inorganic layer 21 may be prepared from an inorganic material to allow the second inorganic layer 21 to have a good ability to block water and oxygen. Specifically, a material of the second inorganic layer 21 may be one of silicon nitride, silicon oxide, or silicon oxynitride. Preferably, the second inorganic layer 21 may be prepared by using a same material as the first inorganic layer 11.

As shown in FIG. 2, the insulating layers 22 may include a first gate insulating layer 220, a second gate insulating layer 221, and an interlayer dielectric layer 222 disposed in a stack. The planarization layers 24 may include a first planarization layer 240 disposed on the interlayer dielectric layer 222 and a second planarization layer 241 disposed on the first planarization layer 240. The metal layers 23 may include a first metal layer 230 disposed on the first gate insulating layer 220, a second metal layer 231 disposed on the second gate insulating layer 221, a third metal layer 232 disposed on the interlayer dielectric layer 222, and a fourth metal layer 233 disposed on the first planarization layer 240.

The display panel also includes a light-emitting layer 30, and the light-emitting layer 30 may include an anode, a hole injection layer, a hole transport layer, an organic light-emitting material layer, an electron transport layer, an electron injection layer, and a cathode that are stacked on the drive circuit layer 20 in sequence. Wherein, the anode and the organic light-emitting material layer are only disposed in the display area AA, and the hole injection layer, the hole transport layer, the electron transport layer, the electron injection layer, and the cathode may all be formed in the display area AA and the non-display area NA by a whole surface evaporation process. It should be noted that the light-emitting layer 30 mentioned in the following description is a general term for the film layers of the hole injection layer, the hole transport layer, the electron transport layer, the electron injection layer, and the cathode that are formed by whole surface evaporation.

In this embodiment, the third organic layer 25 is a pixel definition layer, and a material of the third organic layer 25 may be a black organic photoresist material. The third organic layer 25 may be provided with a plurality of pixel openings, the light-emitting layer 30 may be disposed on the third organic layer 25, and the organic light-emitting material layer of the light-emitting layer 30 may be disposed only in the pixel openings, thereby using the pixel openings to define a plurality of pixel units 31 that can emit light. A color of the light-emitting units 31 may includes, but is not limited to, red, green, and blue.

The base substrate 10 and the drive circuit layer 20 are provided with a through-hole 40 in the photosensitive area PA. The through-hole 40 penetrates the base substrate 10 and the drive circuit layer 20 in a thickness direction of the base substrate 10, thereby improving a light transmittance in the photosensitive area PA. A photosensitive device may be disposed corresponding to the photosensitive area PA, and the photosensitive device may be disposed in the through-hole 40 or under the through-hole 40.

The display panel further includes an encapsulation layer 50. The encapsulation layer 50 is disposed on one side of the light-emitting layer 30 away from the base substrate 10 and covers the light-emitting layer 30.

Further, the second inorganic layer 21 is provided with a first opening 210, the first organic layer 12 is provided with a second opening 120, the first opening 210 is connected to the second opening 120, and a width of the first opening 210 is less than a width of the second opening 120. The light-emitting layer 30 covers the transition area TA and has a disconnected setting in the second opening 120.

The display panel shown in FIG. 2 is taken as an example, the second inorganic layer 21 is provided with the first opening 210, and the first opening 210 may penetrate through the second inorganic layer 21 in the third direction z. The first organic layer 12 is provided with the second opening 120 corresponding to the first opening 210, the first opening 210 and the second opening 120 are connected with each other, and the second opening 120 may be recessed into an interior of the first organic layer 12 from one side surface of the first organic layer 12 adjacent to the second inorganic layer 21 in the third direction z but does not penetrate the first organic layer 12. That is, a bottom surface of the second opening 120 is not in contact with one side surface of the first inorganic layer 11 adjacent to the first organic layer 12, and a part of the organic material of the first organic layer 12 separates the bottom surface of the second opening 120 from the first inorganic layer 11.

Since the width of the first opening 210 is less than the width of the second opening 120, when forming the light-emitting layer 30 by whole surface evaporation, a partial area of the bottom surface of the second opening 120 will be shielded by edges of the first opening 210, light-emitting materials cannot be deposited in this area and will be deposited in an area of the bottom surface of the second opening 120 which is not shielded by the edges of the first opening 210 to form the light-emitting layer 30. Therefore, the light-emitting layer 30 is deposited in the partial area of the bottom surface of the second opening 120 and is disconnected from other portions deposited in the transition area TA.

It should be noted that since the through-hole 40 penetrates the base substrate 10 in the thickness direction of the base substrate 10, and inner walls of the through-hole 40 in the base substrate 10 is not encapsulated, water vapor and oxygen may intrude into an interior of the base substrate 10 from the inner walls of the through-hole 40 and penetrate into the light-emitting layer in the display area AA through the light-emitting layer 30 in the transition area TA and possible cracks in the encapsulation layer 50 in the first opening 210 and the second opening 120 if the light-emitting layer 30 in the transition area TA is not disposed in a disconnected setting. Therefore, the organic light-emitting material in the light-emitting layer 30 in the display area AA may lose effectiveness, thereby causing the display panel to have black hole spots.

By disposing the first inorganic layer 11 under the first organic layer 12, the first inorganic layer 11 has a good ability to block water and oxygen, which can block water and oxygen intrude into the display area AA through the second organic layer disposed under the first inorganic layer 11. At a same time, the light-emitting layer 30 has the disconnected setting in the second opening 120, so a path for water and oxygen intruding into the display area AA through the light-emitting layer 30 can be blocked. Therefore, a risk of the light-emitting materials losing effectiveness can be reduced, and the problem of the display panel having black hole spots can be improved.

Figure 4:
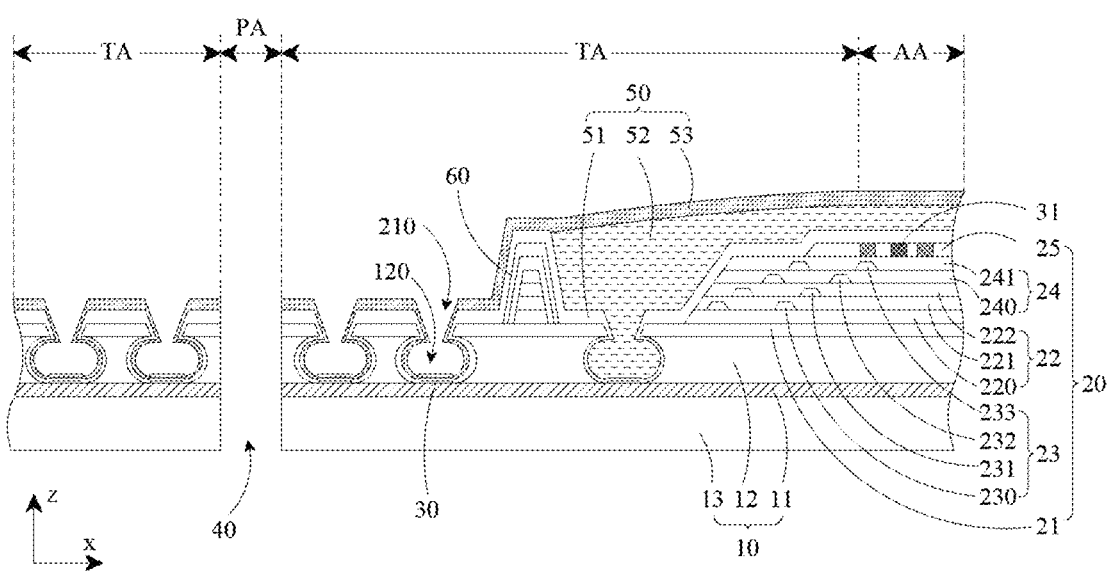
FIG. 4 is a second schematic partial cross-sectional structural diagram of the display panel along the direction A-A according to an embodiment of the present disclosure.
Figure 5:
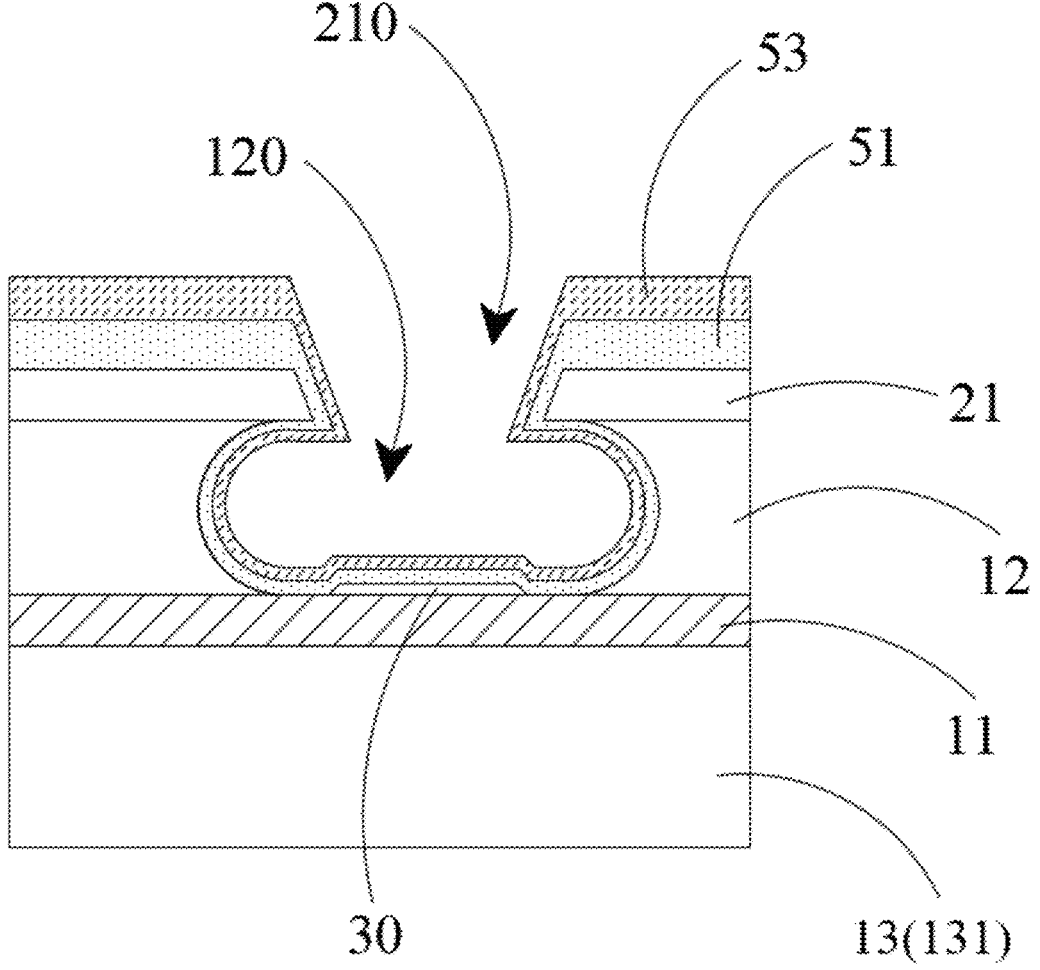
FIG. 5 is a second schematic structural diagram of the display panel in the groove according to an embodiment of the present disclosure.

In an embodiment of the present disclosure, in conjunction with FIGS. 4 and 5, FIG. 4 is a second schematic partial cross-sectional structural diagram of the display panel along the direction A-A according to an embodiment of the present disclosure, and FIG. 5 is a second schematic structural diagram of the display panel in a groove according to an embodiment of the present disclosure. It should be noted that a second structure of the display panel shown in FIG. 4 is basically same as the structure of the display panel shown in FIG. 2, and a difference is that in the second structure of the display panel shown in FIG. 4, the first organic layer 12 is provided with the second opening 120, and the bottom surface of the second opening 120 is in contact with the side surface of the first inorganic layer 11 adjacent to the first organic layer 12. That is, the second opening 120 penetrates through the first organic layer 12 in the thickness direction of the first organic layer 12 and exposes a surface of the first inorganic layer 11 under the first organic layer 12.

It should be noted that since the first inorganic layer 11 and the first organic layer 12 are prepared with inorganic materials and organic materials, respectively, when the first organic layer 12 is etched to form the second opening 120, an etching gas will penetrate the first organic layer 12 without affecting the first inorganic layer 11, and the etching will stop. Therefore, depths of a plurality of second openings 120 formed by etching can be ensured to be completely consistent, thereby improving uniformity of film formation of the encapsulation layer 50 in the second openings 120, thereby reducing a risk of cracks in the encapsulation layer 50 caused by a difference in the depth of the second openings 120.

Further, in the second opening 120, the light-emitting layer 30 is disposed on an exposed side surface of the first inorganic layer 11 adjacent to the first organic layer 12, and a width of the light-emitting layer 30 in the second opening 120 is less than a width of the bottom surface of the second opening 120.

Further, the encapsulation layer 50 is disposed continuously in the second opening 120.

In conjunction with FIGS. 4 and 5, in the second opening 120, the encapsulation layer 50 is in contact with a side wall of the second opening 120, the side surface of the first inorganic layer 11 adjacent to the first organic layer 12, and one side surface of the light-emitting layer 30 away from the first inorganic layer 11. Therefore, the light-emitting layer 30 in the second opening 120 can be completely enclosed by the encapsulation layer 50 and the first inorganic layer 11, thereby preventing the water and oxygen from intruding into the light-emitting layer in the display area AA through the light-emitting layer 30 on the bottom surface of the second opening 120, thereby reducing the risk of the light-emitting materials in the light-emitting layer losing effectiveness.

Further, an orthographic projection of the first opening 210 on the first inorganic layer 11 is within an orthographic projection of the second opening 120 on the first inorganic layer 11.

Figure 3:
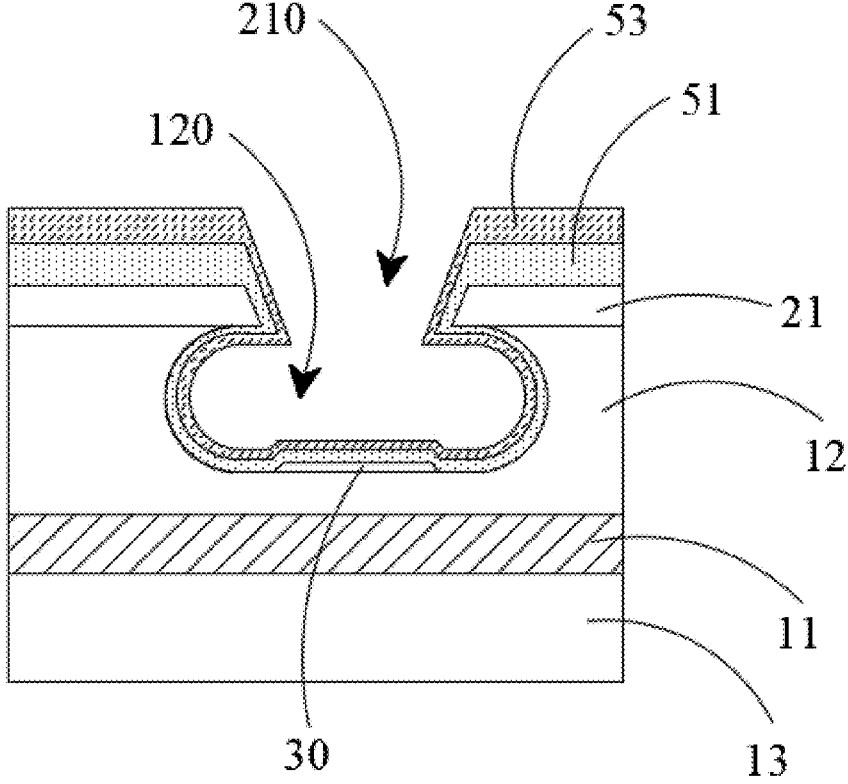
FIG. 3 is a first schematic structural diagram of the display panel in a groove according to an embodiment of the present disclosure.

In an embodiment, as shown in FIG. 3, a shape of the first opening 210 is an inverted trapezoid in a cross-section parallel to the first direction x and the third direction z, the side wall of the first opening 210 is inclined, and the width of the first opening 210 in the first direction x is gradually increased along the third direction z.

The side wall of the second opening 120 is recessed toward inside of the first opening 210, and a cross-section of the second opening 120 parallel to the first direction x and the third direction z is a curved surface. The width of the second opening 120 in the first direction x is gradually increased and then gradually decreased along the third direction z.

It should be noted that by limiting the orthographic projection of the first opening 210 on the first inorganic layer 11 to be within the orthographic projection of the second opening 120 on the first inorganic layer 11, it can allow the width of the second opening 120 in first direction x to be greater than the width of first opening 210 in first direction x. In addition, surrounding edges of the first opening 210 are all protruding from surrounding edges of the second opening 120, so that a part of the first opening 210 protruding from the edges of the second opening 120 can be used to block materials that are deposited to form the light-emitting layer 30, thereby ensuring that the light-emitting layer 30 formed on the bottom surface of the second opening 120 is completely disconnected from the light-emitting layer 30 formed outside the second opening 120, and cannot completely cover the surface of the first inorganic layer 11 exposed by the second opening 120. Therefore, the encapsulation layer 50 formed subsequently can form a completely encapsulated sealing structure with the first inorganic layer 11 to the light-emitting layer 30, thereby completely blocking the path for water and oxygen intruding into the light-emitting layer in the display area from the light-emitting layer 30 on the bottom surface of the second opening 120.

Further, a length from an edge of any side of the first opening 210 to an edge of the second opening 120 on a same side is greater than 0 and is less than or equal to 2 μm.

Figure 6:
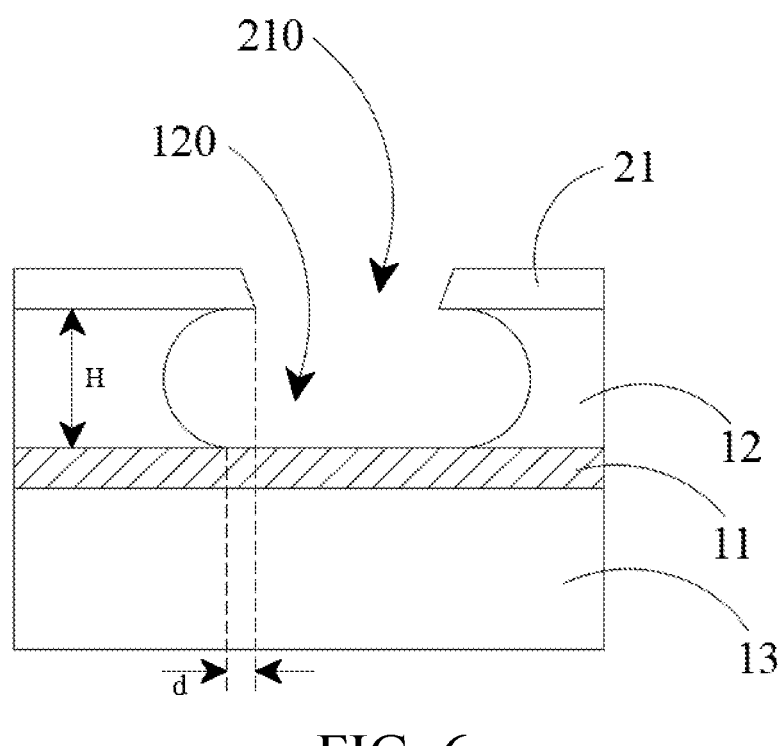
FIG. 6 is a schematic structural diagram of the groove according to an embodiment of the present disclosure.

As shown in FIG. 6, FIG. 6 is a schematic structural diagram of the first opening and the second opening according to an embodiment of the present disclosure. The surrounding edges of the first opening 210 are all protruding from the surrounding edges of the second opening 120, and a distance d between a lower edge of the first opening 210 and a lower edge of the second opening 120 may be 0.2 μm, 0.5 μm, 1 μm, 1.5 μm, or 2 μm. Therefore, the light-emitting layer 30 on the bottom of the second opening 120 can be ensured to be completely disconnected from the light-emitting layer 30 outside the second opening 120, thereby blocking the path for water and oxygen intruding into the light-emitting layer in the display area AA through the light-emitting layer 30 in the second opening 120.

Further, as shown in FIG. 6, a distance H between one side surface of the first inorganic layer 11 adjacent to the first organic layer 12 and one side surface of the second inorganic layer 21 adjacent to the first organic layer 12 is greater than or equal to 1.5 μm and is less than or equal to 3 μm. For example, the distance H between the side surface of the first inorganic layer 11 adjacent to the first organic layer 12 and the side surface of the second inorganic layer 21 adjacent to the first organic layer 12 may be 1.5 μm, 1.8 μm, 2 μm, 2.5 μm, 2.8 μm, or 3 μm.

It should be noted that when the distance between the first inorganic layer 11 and the second inorganic layer 21 is too small, the light-emitting layer 30 in the second opening 120 cannot be disconnected from the light-emitting layer 30 outside the second opening 120, and the first inorganic layer 11 and the encapsulation layer 50 cannot completely encapsulate the light-emitting layer 30 on the bottom of the second opening 120. Therefore, water and oxygen may intrude into the light-emitting layer in the display area AA through the light-emitting layer in the second opening 120, thereby causing the light-emitting materials in the light-emitting layer to lose effectiveness. When the distance between the first inorganic layer 11 and the second inorganic layer 21 is too large, the encapsulation layer 50 deposited in the second opening 120 will be disconnected, resulting in cracks, and a continuous enclosed structure cannot be formed on the side wall and the bottom of the first opening 210 and the second opening 120. Therefore, an encapsulation effect of the encapsulation layer 50 is reduced, and water and oxygen may intrude into the light-emitting layer through the cracks on the encapsulation layer 50, thereby causing the light-emitting materials in the light-emitting layer to lose effectiveness.

Therefore, by limiting the distance H between the side surface of the first inorganic layer 11 adjacent to the first organic layer 12 and the side surface of the second inorganic layer 21 adjacent to the first organic layer 12 to range from 1.5 μm to 3 μm, the encapsulation effect of the encapsulation layer 50 can be ensured, it can also ensure that the encapsulation layer 50 and the first inorganic layer 11 completely encapsulate the light-emitting layer 30, and the path for water and oxygen intruding into the light-emitting layer from the light-emitting layer 30 on the bottom of the second opening 120 can be completely blocked.

Further, the display panel further includes a retaining wall 60 disposed in the transition area TA and surrounding the photosensitive area PA, wherein, the retaining wall 60 is disposed on one side of the second inorganic layer 21 away from the first organic layer 12.

The retaining wall 60 may have a multi-layer stacked structure or a single-layer structure. As shown in FIG. 4, the retaining wall 60 may be formed using processes and materials of the first gate insulating layer 220, the second gate insulating layer 221, the interlayer dielectric layer 222, the first planarization layer 240, the second planarization layer 241, and the third organic layer 25, thereby forming the multi-layer stacked structure. In practical applications, the retaining wall 60 may be formed only using the film formation process and material of the third organic layer 25 and may be simultaneously prepared with the third organic layer 25.

Further, the encapsulation layer 50 includes a first inorganic encapsulation layer 51, a second inorganic encapsulation layer 53 disposed on the first inorganic encapsulation layer 51, and an organic encapsulation layer 52 disposed between the first inorganic encapsulation layer 51 and the second inorganic encapsulation layer 53.

The first inorganic encapsulation layer 51 and the second inorganic encapsulation layer 53 are both disposed in the display area AA and the transition area TA, and the first inorganic encapsulation layer 51 and the second inorganic encapsulation layer 53 also cover the retaining wall 60. The retaining wall 60 may be used to define a diffusion boundary of the organic material forming the organic encapsulation layer 52, so the organic encapsulation layer 52 is formed only on one side of the retaining wall 60 away from the photosensitive area PA.

Further, one side of the retaining wall 60 adjacent to the photosensitive area PA and one side of the retaining wall 60 away from the photosensitive area PA are both provided with the first opening 210 and the second opening 120.

As shown in FIG. 4, on one side of the retaining wall 60 adjacent to the display area AA, the first inorganic encapsulation layer 51 covers the side walls of the first opening 210 and the second opening 120, the light-emitting layer 30 on the bottom surface of the second opening 120, and the first inorganic layer 11 which is not covered by the light-emitting layer 30, and the first inorganic encapsulation layer 51 and the first inorganic layer 11 form a sealing structure enclosing the light-emitting layer 30. The organic encapsulation layer 52 is disposed on the first inorganic encapsulation layer 51 and fills the second opening 120 and the first opening 210, and the second inorganic encapsulation layer 53 is disposed on the organic encapsulation layer 52.

In conjunction with FIGS. 4 and 5, on one side of the retaining wall 60 adjacent to the photosensitive area PA, the first inorganic encapsulation layer 51 covers the side walls of the first opening 210 and the second opening 120, the light-emitting layer 30 on the bottom surface of the second opening 120, and the first inorganic layer 11 which is not covered by the light-emitting layer 30, and the first inorganic encapsulation layer 51 and the first inorganic layer 11 form a sealing structure enclosing the light-emitting layer 30. The second inorganic encapsulation layer 53 covers the first inorganic encapsulation layer 51 in the first opening 210 and the second opening 120, and also covers the first inorganic encapsulation layer 51 on the second inorganic layer 21.

Further, the display panel includes a plurality of first openings 210 and a plurality of second openings 120, each of the first openings 210 and a corresponding one of the second openings 120 are connected to each other, and the first openings 210 and the second openings 120 surround the photosensitive area PA layer by layer.

Figure 7:
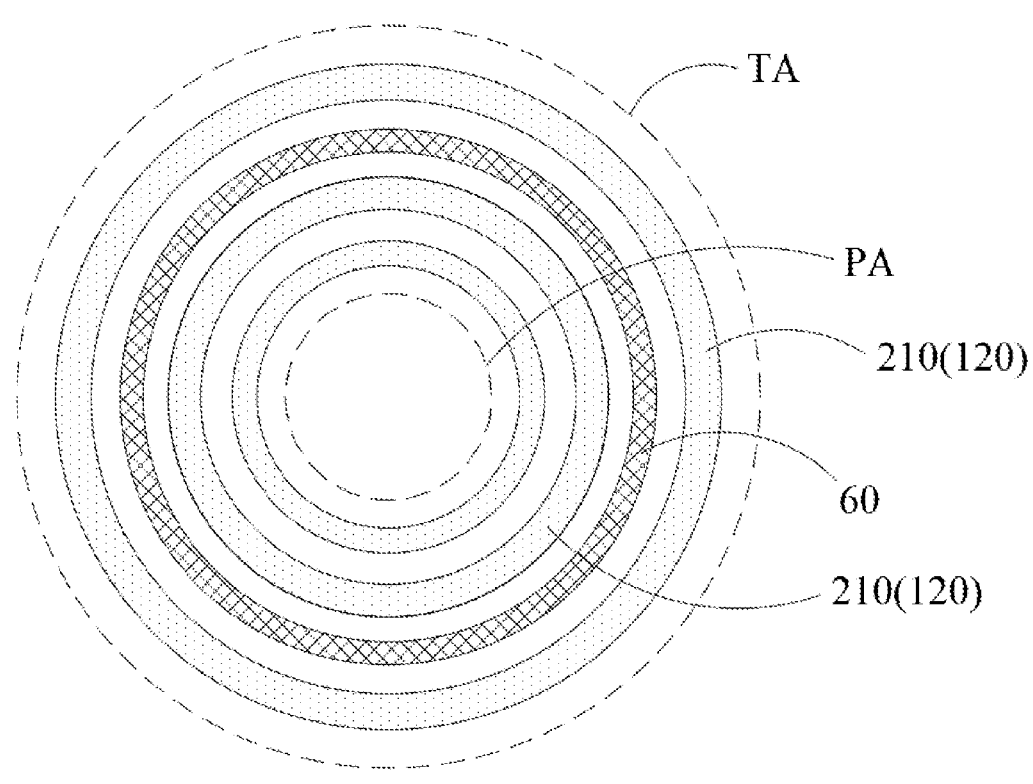
FIG. 7 is a schematic planar diagram of a transition area and a light transmitting area according to an embodiment of the present disclosure.

In conjunction with FIGS. 4 and 7, FIG. 7 is a schematic planar diagram of the transition area and a light transmitting area according to an embodiment of the present disclosure. In this embodiment, the side of the retaining wall 60 adjacent to the photosensitive area PA is provided with two sets of the first openings 210 and the second openings 120, and the two sets of the first openings 210 and the second openings 120 surround the photosensitive area PA layer by layer, thereby reducing a lateral path for water and oxygen intruding into the display area AA from one side surface of the base substrate 10, thereby reducing the risk of the light-emitting materials losing effectiveness caused by water and oxygen intrusion.

In this embodiment, the photosensitive area PA is circular, and the first openings 210 and the second openings 120 on both sides of the retaining wall 60 are annular groove structures surrounding the photosensitive area PA. In practical applications, the photosensitive area PA may also be a water drop shape, an ellipse, or other irregular shapes, and shapes of the first openings 210 and the second openings 120 may be adapted to a water drop shape, an ellipse ring, or other irregular shapes surrounding the photosensitive area PA, which are not limited herein.

According to the display panel provided by the above embodiments of the present disclosure, an embodiment of the present disclosure further provides a method for manufacturing the display panel, and the method for manufacturing the display panel is used to prepare the display panel provided in the above embodiments. As shown in FIGS. 8a to 8d, FIGS. 8a to 8d are schematic structural diagrams of a manufacturing method of the display panel according to an embodiment of the present disclosure. The manufacturing method of the display panel has following steps:

step S10: disposing the first inorganic layer 11 and the first organic layer 12 on the substrate 13;

step 20: disposing the drive circuit layer and the retaining wall 60 on one side of the first organic layer 12 away from the first inorganic layer 11;

step S30: forming the first opening 210 on the second inorganic layer 21 of the drive circuit layer;

step S40: on the basis of the first opening 210, forming the second opening 120 that has the width less than the first opening 210 and is connected to the first opening 210 on the first organic layer 12;

step S50: disposing the light-emitting layer on one side of the drive circuit layer away from the base substrate 10, wherein, the light-emitting layer is disconnected in the second opening 120; and step S60: forming the encapsulation layer 50 on one side of the light-emitting layer away from the base substrate 10.

In the step S10, the substrate 13 includes a second organic layer, and the first inorganic layer 11 and the first organic layer 12 may be sequentially formed on the second organic layer.

The first organic layer 12 and the second organic layer are both prepared from organic materials. For example, the organic materials may include, but are not limited to, one or more mixtures of polyimide (PI), polyamide (PA), polycarbonate (PC), polyphenylene ether sulfone (PES), polyethylene terephthalate (PET), polyethylene naphthalate (PEN), polymethyl methacrylate (PMMA), or cyclic olefin copolymer (COC). Preferably, the first organic layer 12 and the second organic layer are prepared using a same material.

In this embodiment of the present disclosure, the substrate 13 may be a single-layered organic film layer structure composed of the second organic layer. In some embodiments, the substrate 13 may also be a two-layered or multi-layered organic film layer structure composed of two layers or multiple layers of organic film layers stacked in sequence.

The first inorganic layer 11 is prepared from an inorganic material and has a good ability to block water and oxygen. Specifically, the first inorganic layer 11 is formed from one or both of silicon nitride and silicon oxide. A water vapor transmission rate (WVTR) of the first inorganic layer 11 is about 10-6/m2/day.

The second inorganic layer 21 is prepared from an inorganic material and has a good ability to block water and oxygen. Specifically, the second inorganic layer 21 is formed from one or both of silicon nitride and silicon oxide. Preferably, the second inorganic layer 21 may be prepared by using a same material as the first inorganic layer 11.

Figure 8A:
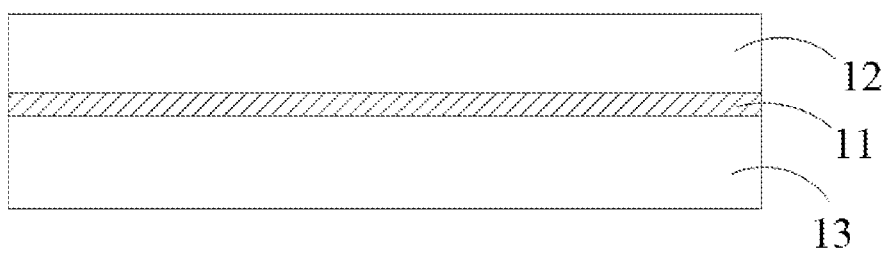
FIGS. 8a to 8d are schematic structural diagrams of a manufacturing method of the display panel according to an embodiment of the present disclosure.
Figure 8B:
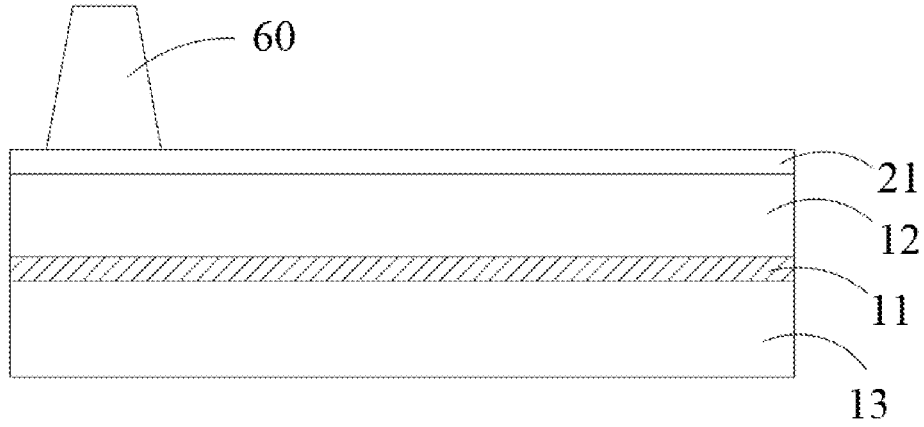

In conjunction with FIGS. 8a to 8b, FIG. 8b does not show the insulating layers, the metal layers, the planarization layers, and the pixel definition layer. The structures of the insulating layers, metal layers, planarization layers, and pixel definition layer can be referred to FIG. 2 and FIG. 4, which will not be repeated here.

In the step S20, the retaining wall 60 may adopt the process of the third organic layer in the drive circuit layer to be prepared simultaneously with the third organic layer, and the structure of the drive circuit layer can refer to the structure of drive circuit layer 20 in FIG. 2 and FIG. 4, which will not be repeated here.

Figure 8C:
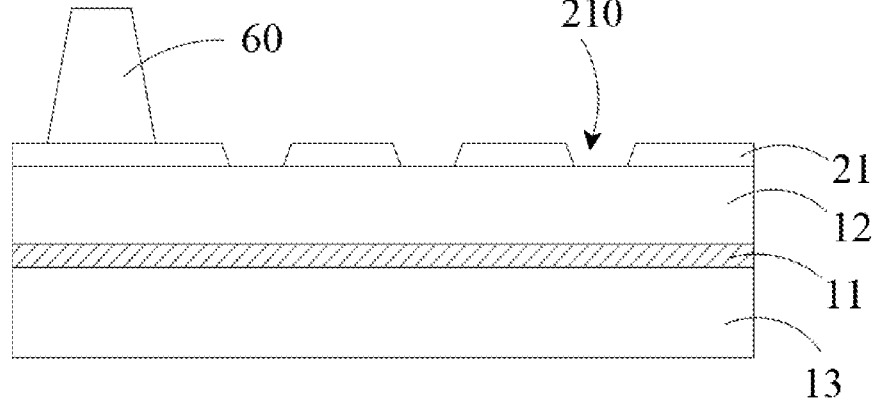

In the step S30, as shown in FIG. 8c, a patterned first opening 210 can be formed on the second inorganic layer 21 by photolithography. The first opening 210 is an annular opening surrounding the photosensitive area, and the first opening 210 penetrates the second inorganic layer 21 in the thickness direction of the second inorganic layer 21.

Figure 8D:
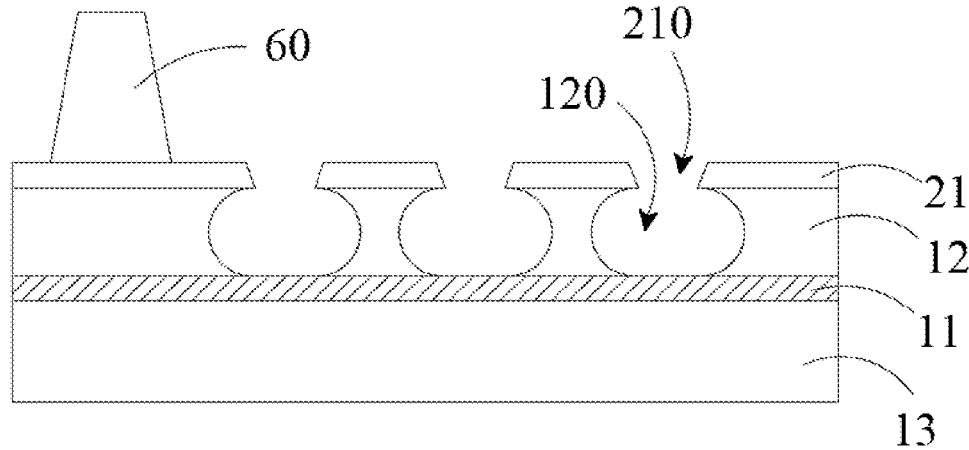

In the step S40, as shown in FIG. 8d, on the basis of the first opening 210, the first organic layer 12 may be etched with $O_2$ by a gas etching method to form a patterned second opening 120. The second opening 120 is an annular opening surrounding the photosensitive area.

In the embodiment shown in FIG. 8d, the second opening 120 may penetrate the first organic layer 12 and expose the first inorganic layer 11. In other embodiments, as shown in FIG. 2, the second opening 120 may also only extend into the first organic layer 12, but not penetrate the first organic layer 12.

In the step S50, the light-emitting layer 30 may include an anode, a hole injection layer, a hole transport layer, an organic light-emitting material layer, an electron transport layer, an electron injection layer, and a cathode that are stacked on the drive circuit layer 20 in sequence. The anode and the organic light-emitting material layer are only disposed in the display area, and the hole injection layer, the hole transport layer, the electron transport layer, the electron injection layer, and the cathode can all be formed in the display area and the non-display area by the whole surface evaporation process.

In the step S50, since the width of the first opening 210 is less than the width of the second opening 120, when the light-emitting layer 30 is formed by deposition, the surrounding edges of the first opening 210 can shield the second opening 120, and the light-emitting layer 30 can only be deposited on the bottom surface of the second opening 120. Therefore, the part of the light-emitting layer 30 in the second opening 120 can be disconnected from other parts.

In the step S60, the encapsulation layer 50 may be a thin film encapsulation structure formed by successively stacking the first inorganic encapsulation layer, the organic encapsulation layer, and the second inorganic encapsulation layer. The first inorganic encapsulation layer and the second inorganic encapsulation layer can be formed by whole-surface deposition, and the first inorganic encapsulation layer can be formed on the side walls of the first opening 210 and the second opening 120 and cover the light-emitting layer disposed on the bottom surface of the second opening 120 and the first inorganic layer 11 not covered by the light-emitting layer. Therefore, the first inorganic encapsulation layer and the first inorganic layer 11 can be used to form a sealing structure for the light-emitting layer on the bottom surface of the second opening 120, thereby completely blocking the path of water and oxygen intruding into the light-emitting layer through the light-emitting layer in the second opening 120. Meanwhile, the first inorganic layer 11 can be used as a blocking effect for etching the first organic layer 12, so the depths of the second openings 120 formed by etching can be consistent, thereby ensuring the encapsulation layer 50 can be continuously deposited in the second opening 120 to prevent cracks from forming in the encapsulation layer 50 in the second opening 120, thereby reducing the risk of the light-emitting materials in the light-emitting layer losing effectiveness.

According to the display panel provided by the above embodiments of the present disclosure, an embodiment of the present disclosure further provides a display device. The display device includes the display panel provided in the above embodiments. The display device may be a mobile terminal, such as a color electronic paper, a color e-book, a smart phone, etc., the display device may also be a wearable terminal, such as a smart watch, a smart wristband, etc., and the display device may also be a fixed terminal, such as a color electronic billboard, a color electronic poster, etc.

The embodiments of the present disclosure provide the display panel and the display device. The display device includes the display panel. The display panel has a photosensitive area, a transition area surrounding the photosensitive area, and a display area surrounding the transition area and includes: a base substrate including an inorganic protective layer and a first surface and a second surface disposed opposite to each other, wherein, the inorganic protective layer is disposed between the first surface and the second surface, and is arranged at an interval from the first surface and the second surface; a display functional layer disposed on one side of the first surface away from the second surface; a photosensitive hole disposed in the photosensitive area, wherein, the photosensitive hole penetrates the base substrate in the thickness direction of the base substrate; a groove disposed in the transition area and surrounding the photosensitive area, wherein, the groove is recessed into the base substrate from the first surface of the base substrate, and is located on one side of the inorganic protective layer adjacent to the first surface; and an encapsulation layer disposed on the display functional layer and covering the side walls and bottom of the groove. Therefore, by disposing the inorganic protective layer inside the base substrate, a lateral intrusion path from the through-hole in the photosensitive area of the base substrate to the display area for water and oxygen can be blocked, thereby preventing water and oxygen from accumulating in the transition area. Therefore, poor display such as black hole spots caused by water and oxygen intrusion can be solved.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A display panel, having a photosensitive area, a transition area surrounding the photosensitive area, and a display area surrounding the transition area and comprising:

a base substrate comprising a substrate, a first inorganic layer, and a first organic layer stacked in sequence;

a drive circuit layer disposed on one side of the base substrate, wherein the drive circuit layer comprises a second inorganic layer, the first organic layer is disposed between the first inorganic layer and the second inorganic layer, the second inorganic layer is provided with a first opening in the transition area, the first organic layer is provided with a second opening in the transition area, the first opening is connected to the second opening, a width of the first opening is less than a width of the second opening, and an orthographic projection of the first opening on the first inorganic layer is within an orthographic projection of the second opening on the first inorganic layer;

a light-emitting layer disposed on one side of the drive circuit layer away from the base substrate, wherein the light-emitting layer covers the transition area and has a disconnected setting in the second opening; and an encapsulation layer disposed on one side of the light-emitting layer away from the base substrate;

wherein a distance in a first direction from an edge of any side of the first opening to an edge of the second opening on a same side is greater than 0 and is less than or equal to 2 μm, and the first direction being a width direction of the display panel;

wherein a distance between one side surface of the first inorganic layer adjacent to the second inorganic layer and one side surface of the second inorganic layer adjacent to the first inorganic layer ranges from 1.5 μm to 3 μm; and wherein a cross-sectional shape of the first opening, when viewed along the first direction and a third direction, is an inverted trapezoid, and the third direction being perpendicular to the first direction.

2. The display panel according to claim 1, wherein materials of the first inorganic layer and the second inorganic layer are same.

3. The display panel according to claim 1, wherein the substrate comprises a second organic layer disposed on one side of the first inorganic layer away from the first organic layer, and a material of the second organic layer is same as a material of the first organic layer.

4. The display panel according to claim 1, wherein the base substrate and the drive circuit layer are provided with a through-hole in the photosensitive area.

5. The display panel according to claim 1, wherein a bottom surface of the second opening is in contact with one side surface of the first inorganic layer adjacent to the first organic layer.

6. The display panel according to claim 5, wherein in the second opening, the light-emitting layer is disposed on the side surface of the first inorganic layer adjacent to the first organic layer, and a width of the light-emitting layer in the second opening is less than a width of the bottom surface of the second opening.

7. The display panel according to claim 6, wherein the encapsulation layer is disposed continuously in the second opening.

8. The display panel according to claim 7, wherein in the second opening, the encapsulation layer is in contact with a side wall of the second opening, the side surface of the first inorganic layer adjacent to the first organic layer, and one side surface of the light-emitting layer away from the first inorganic layer.

9. A display device, comprising a photosensitive device and a display panel, wherein the display panel has a photosensitive area, a transition area surrounding the photosensitive area, and a display area surrounding the transition area and comprises:

a base substrate comprising a substrate, a first inorganic layer, and a first organic layer stacked in sequence;

a drive circuit layer disposed on one side of the base substrate, wherein the drive circuit layer comprises a second inorganic layer, the first organic layer is disposed between the first inorganic layer and the second inorganic layer, the second inorganic layer is provided with a first opening in the transition area, the first organic layer is provided with a second opening in the transition area, the first opening is connected to the second opening, a width of the first opening is less than a width of the second opening, and an orthographic projection of the first opening on the first inorganic layer is within an orthographic projection of the second opening on the first inorganic layer;

a light-emitting layer disposed on one side of the drive circuit layer away from the base substrate, wherein the light-emitting layer covers the transition area and has a disconnected setting in the second opening; and an encapsulation layer disposed on one side of the light-emitting layer away from the base substrate;

wherein a distance in a first direction from an edge of any side of the first opening to an edge of the second opening on a same side is greater than 0 and is less than or equal to 2 μm, and the first direction being a width direction of the display panel; and wherein a distance between one side surface of the first inorganic layer adjacent to the second inorganic layer and one side surface of the second inorganic layer adjacent to the first inorganic layer ranges from 1.5 μm to 3 μm.

10. The display device according to claim 9, wherein a bottom surface of the second opening is in contact with one side surface of the first inorganic layer adjacent to the first organic layer.

11. The display device according to claim 10, wherein in the second opening, the light-emitting layer is disposed on the side surface of the first inorganic layer adjacent to the first organic layer, and a width of the light-emitting layer in the second opening is less than a width of the bottom surface of the second opening.

12. The display device according to claim 11, wherein the encapsulation layer is disposed continuously in the second opening.

13. The display device according to claim 12, wherein in the second opening, the encapsulation layer is in contact with a side wall of the second opening, the side surface of the first inorganic layer adjacent to the first organic layer, and one side surface of the light-emitting layer away from the first inorganic layer.

14. A display panel, having a photosensitive area, a transition area surrounding the photosensitive area, and a display area surrounding the transition area and comprising:

a base substrate comprising a substrate, a first inorganic layer, and a first organic layer stacked in sequence;

a drive circuit layer disposed on one side of the base substrate, wherein the drive circuit layer comprises a second inorganic layer, the first organic layer is disposed between the first inorganic layer and the second inorganic layer, the second inorganic layer is provided with a first opening in the transition area, the first organic layer is provided with a second opening in the transition area, the first opening is connected to the second opening, a width of the first opening is less than a width of the second opening, and an orthographic projection of the first opening on the first inorganic layer is within an orthographic projection of the second opening on the first inorganic layer;

a light-emitting layer disposed on one side of the drive circuit layer away from the base substrate, wherein the light-emitting layer covers the transition area and has a disconnected setting in the second opening; and an encapsulation layer disposed on one side of the light-emitting layer away from the base substrate;

wherein the display panel further comprises a retaining wall disposed in the transition area and surrounding the photosensitive area, wherein the retaining wall is disposed on one side of the second inorganic layer away from the first organic layer; and wherein one side of the retaining wall adjacent to the photosensitive area and one side of the retaining wall away from the photosensitive area are both provided with the first opening and the second opening;

wherein the drive circuit layer comprises a pixel definition layer, and a material of the retaining wall is same as a material of the pixel definition layer; and wherein a distance between one side surface of the first inorganic layer adjacent to the second inorganic layer and one side surface of the second inorganic layer adjacent to the first inorganic layer ranges from 1.5 μm to 3 μm.

15. The display panel according to claim 14, wherein the light-emitting layer is disposed on the pixel definition layer.

* * * * *